United States Patent
Goh et al.

(10) Patent No.: US 10,256,213 B2
(45) Date of Patent: Apr. 9, 2019

(54) REDUCED-HEIGHT ELECTRONIC MEMORY SYSTEM AND METHOD

(71) Applicant: Intel Corporation, Santa Clara, CA (US)

(72) Inventors: Eng Huat Goh, Penang (MY); Min Suet Lim, Simpang Ampat (MY); Jiun Hann Sir, Gelugor (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/964,972

(22) Filed: Dec. 10, 2015

(65) Prior Publication Data
US 2017/0170147 A1 Jun. 15, 2017

(51) Int. Cl.
*H01L 23/02* (2006.01)
*H01L 23/34* (2006.01)
(Continued)

(52) U.S. Cl.
CPC ...... *H01L 25/0657* (2013.01); *H01L 23/3128* (2013.01); *H01L 25/105* (2013.01);
(Continued)

(58) Field of Classification Search
CPC ... H01L 25/50; H01L 27/108; H01L 25/0657; H01L 2225/0652; H01L 2225/06586;
(Continued)

(56) References Cited

U.S. PATENT DOCUMENTS 7,709,944 B2 * 5/2010 Kuan ............... H01L 25/03
257/686
2006/0065972 A1 3/2006 Khan et al.
(Continued)

FOREIGN PATENT DOCUMENTS

KR 1020070021376 A 3/2007

OTHER PUBLICATIONS

"International Application Serial No. PCT/US2016/061043, International Search Report dated Feb. 20, 2017", 3 pgs.
(Continued)

*Primary Examiner* — Kimberly Rizkallah
*Assistant Examiner* — Dilinh Nguyen
(74) *Attorney, Agent, or Firm* — Schwegman Lundberg & Woessner, P.A.

(57) ABSTRACT

A computer memory module can include a molded layer disposed on a DRAM substrate. The molded layer can encapsulate a DRAM die and wire bonds that connect the DRAM die to the DRAM substrate, and can be shaped to include at least one cavity having a footprint sized to accommodate a system on chip (SOC) die. The DRAM module can attach to an SOC package so that the SOC die and the DRAM die are both positioned between the DRAM substrate and the SOC package, the DRAM substrate can form its electrical connections on only one side of the DRAM substrate, and the SOC die can fit at least partially into the cavity in the molded layer. This can reduce a package Z-height, compared to conventional DRAM packages in which the SOC die and the DRAM die are positioned on opposite sides of the DRAM substrate.

13 Claims, 6 Drawing Sheets

(51) Int. Cl.
*H01L 23/48* (2006.01)
*H01L 23/52* (2006.01)
*H01L 25/065* (2006.01)
*H01L 25/00* (2006.01)
*H01L 27/108* (2006.01)
*H01L 23/31* (2006.01)
*H01L 25/10* (2006.01)
*H01L 25/18* (2006.01)

(52) U.S. Cl.
CPC ............ *H01L 25/50* (2013.01); *H01L 27/108* (2013.01); *H01L 25/18* (2013.01); *H01L 2224/32145* (2013.01); *H01L 2224/48091* (2013.01); *H01L 2224/48227* (2013.01); *H01L 2225/0651* (2013.01); *H01L 2225/0652* (2013.01); *H01L 2225/06548* (2013.01); *H01L 2225/06586* (2013.01); *H01L 2225/1023* (2013.01); *H01L 2225/1058* (2013.01); *H01L 2225/1088* (2013.01); *H01L 2924/1532* (2013.01); *H01L 2924/15311* (2013.01); *H01L 2924/15331* (2013.01); *H01L 2924/1815* (2013.01); *H01L 2924/18161* (2013.01)

(58) Field of Classification Search
CPC ... H01L 2225/06548; H01L 2225/0651; H01L 25/117; H01L 25/043; H01L 25/074; H01L 25/0756; H01L 27/3209
USPC .......................................... 257/686, 723, 777
See application file for complete search history.

(56) References Cited

U.S. PATENT DOCUMENTS

| | | | |
|---|---|---|---|
| 2006/0121718 A1* | 6/2006 | Machida | H01L 23/5389 438/612 |
| 2008/0142957 A1 | 6/2008 | Wang et al. | |
| 2009/0016032 A1* | 1/2009 | Chow | H01L 25/03 361/749 |
| 2009/0224390 A1 | 9/2009 | Yang | |
| 2010/0148354 A1* | 6/2010 | Choi | H01L 23/147 257/698 |
| 2011/0031634 A1* | 2/2011 | Pagaila | H01L 21/568 257/777 |
| 2013/0297863 A1* | 11/2013 | Vogt | G11C 7/1075 711/103 |
| 2015/0262902 A1 | 9/2015 | Shen et al. | |

OTHER PUBLICATIONS

"International Application Serial No. PCT/US2016/061043, Written Opinion dated Feb. 20, 2017", 7 pgs.

* cited by examiner

REDUCED-HEIGHT ELECTRONIC MEMORY SYSTEM AND METHOD

BACKGROUND

For each successive generation of a computing device, such as a smart phone, it is generally desirable to reduce the size of internal components of the computing device, such as memory. Reducing the size of a component within a particular volume of the computing device can make room for other components, which can be beneficial.

SUMMARY

In some examples, a memory system can include an upper substrate. A first upper die can be positioned on a bottom of the upper substrate and can electrically connect to the upper substrate with a first plurality of wire bonds. An encapsulant layer can be disposed on a bottom of the upper substrate and can encapsulate the first upper die and the first plurality of wire bonds. The encapsulant layer can be shaped to include at least one cavity having a footprint sized to accommodate a lower die.

In some examples, a dynamic random-access memory (DRAM) system can include a DRAM package core having a top side that lacks electrical connections. A DRAM package build-up layer can be disposed on a bottom side of the DRAM package core and can include electrically conductive material. A first DRAM die can be positioned on a bottom of the DRAM package build-up layer and can electrically connect to the DRAM package build-up layer with a first plurality of wire bonds. An encapsulant layer can be disposed on a bottom of the DRAM package build-up layer and can encapsulate the first DRAM die and the first plurality of wire bonds. The encapsulant layer can be shaped to include at least one cavity having a footprint sized to accommodate a system on chip (SOC) die. The encapsulant layer can define a plurality of vias extending through the encapsulant layer to the DRAM package build-up layer. Each of the plurality of vias can be filled with electrically conductive solder.

Some examples can include a method for fabricating a dynamic random-access memory (DRAM) module. An adhesive film can be applied on a portion of a DRAM substrate. A first DRAM die can be adhered to the DRAM substrate via the adhesive film. The first DRAM die can electrically connect to the DRAM substrate with a first plurality of wire bonds. A molded layer can be injection-molded on the DRAM substrate. The molded layer can encapsulate the first DRAM die and the first plurality of wire bonds. The molded layer can be shaped to include at least one cavity having a footprint sized to accommodate a system on chip (SOC) die. A plurality of vias can be laser drilled through the molded layer to the DRAM substrate. Solder paste can be deposited in the plurality of vias. In some examples, the solder paste can be heated to reflow the solder paste.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various examples discussed in the present document.

DETAILED DESCRIPTION

Figure 1:
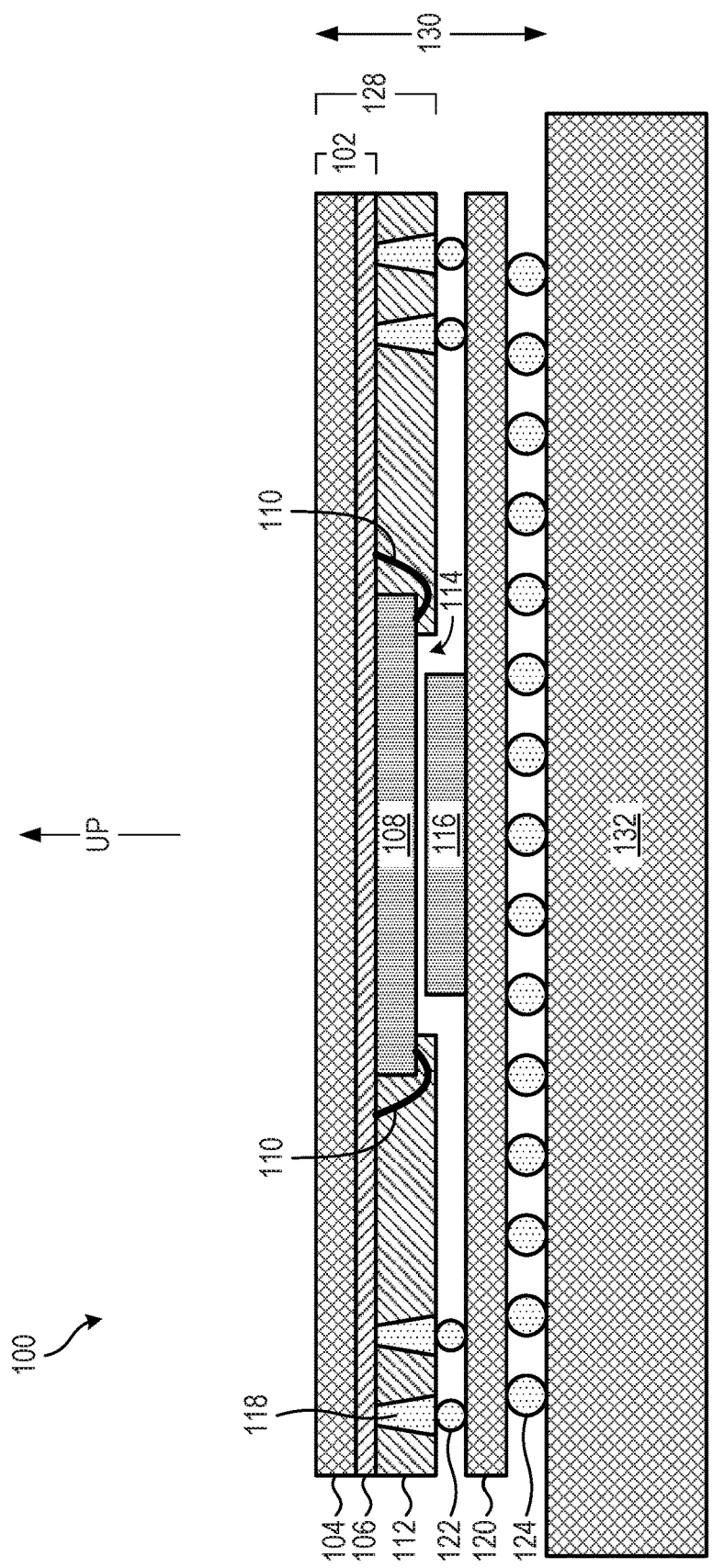
FIG. 1 shows a cross-sectional side view of an example of a memory system having a single upper die and a cavity laterally aligned with the upper die, in accordance with some embodiments.

The notation of FIG. 1-5 denotes a direction of "up" as pointing toward the top of the drawing, and denotes relative positions "top" and "bottom" to indicate positions further away from a motherboard and closer to the motherboard, respectively, when the memory system is assembled, and "lateral" to denote directions perpendicular to "up". It will be understood that positions "top", "bottom", "upper" and "lower" are used only for convenience, and are not intended to describe absolute or relative positions when the memory system is assembled, or when any of the components of the memory system are in use, in storage, or in shipment.

The memory system and memory modules discussed in this document are applicable to several different types of computer memory. Examples of suitable computer memory can include, but are not limited to, dynamic random-access memory (DRAM), static random-access memory (SRAM), flash memory, system on chip (SOC), and other types of volatile semiconductor memory and non-volatile semiconductor memory. For each instance of an element denoted as upper or lower, the element can include any suitable memory type. For instance, a memory system can be a dynamic random-access memory (DRAM) system, an upper substrate can be a DRAM substrate, an upper package core can be a DRAM package core, an upper package build-up layer can be a DRAM package build-up layer, an upper die can be a DRAM die, and so forth.

In some examples, a computer memory module can include a molded layer disposed on a DRAM substrate. The molded layer can encapsulate a DRAM die and wire bonds that connect the DRAM die to the DRAM substrate, and can be shaped to include at least one cavity having a footprint sized to accommodate a system on chip (SOC) die. The DRAM module can attach to an SOC package so that the SOC die and the DRAM die are both positioned between the DRAM substrate and the SOC package, the DRAM substrate can form its electrical connections on only one side of the DRAM substrate, and the SOC die can fit at least partially into the cavity in the molded layer. This can reduce a package Z-height, compared to conventional DRAM packages in which the SOC die and the DRAM die are positioned on opposite sides of the DRAM substrate.

FIG. 1 shows a cross-sectional side view of an example of a memory system 100 for a computing device, in accordance with some embodiments. In some examples, memory system 100 can be a dynamic random-access memory (DRAM) system. The memory system 100 of FIG. 1 is but one example of a memory system; other suitable memory systems can also be used.

Memory system 100 can include an upper substrate 102. As discussed above, the designation of upper is intended to denote that substrate 102 is relatively far away from a motherboard, when the memory system 100 is assembled (compared to a lower substrate, discussed below, which is relatively close to the motherboard, when the memory system 100 is assembled). In some examples, upper substrate 102 can be a DRAM substrate. The upper substrate 102 can be generally planar, and can include one or more electrical components and/or one or more electrical connectors arranged in a predetermined pattern. The upper substrate 102 can be configured to mechanically and electrically attach to a lower package 120, which in turn can mechanically and electrically attach to a motherboard 132. In some examples, the lower package can be a system on chip (SOC) package. In some examples, the upper substrate 102 can be specified, ordered and manufactured as a distinct part, which can be used downstream during assembly of the memory system 100.

In some examples, the upper substrate 102 can be formed as a layered structure. In some examples, upper substrate 102 can include an upper package core 104, which can be relatively rigid and can provide mechanical support for the upper substrate 102. In some examples, the upper package core 104 can be a DRAM package core. The upper package core 104 can mechanically support one or more electrical components attached to the upper substrate 102. The upper substrate 102 can include build-up layers on either side or both sides of the upper package core 104. The build-up layer(s) can include electrically conductive material arranged in a specified pattern, in order to provide electrical connections among electrical components attached to the upper substrate 102 and external elements that connect to the upper substrate 102.

An advantage of the design of FIG. 1 is that the upper substrate 102 includes a build-up layer 106 on only one side of the upper package core 104. Compared with substrates that include build-up layers on both side of the upper package core, the upper substrate 102 of FIG. 1 can have a reduced thickness, where the thickness of upper substrate 102 corresponds to a thickness of one build-up layer.

In the specific configuration of FIG. 1, upper package core 104 can have a top side that lacks electrical connections, and upper package build-up layer 106 can be disposed on a bottom side of the upper package core 104 and can include electrically conductive material.

An upper die 108 can be positioned on a bottom of the upper substrate 102. In some examples, the upper die 108 can be a DRAM die. The upper die 108 can include memory that can be used with one or more processors. In some examples, the memory can include capacitors, which can retain an electric charge for a period of time, and can be refreshed periodically by suitable circuitry. The upper die 108 can electrically connect to the upper substrate 102 with a plurality of wire bonds 110. In some examples, the upper die 108 can be adhered to the upper substrate 102 with an adhesive material. In some examples, at least some of the wire bonds 110 connect to the upper package build-up layer 106. In some examples, the upper die 108 can be generally planar, with a rectangular footprint (e.g., a rectangular shape when viewed in a direction perpendicular to the plane of the upper die 108). Other shapes and sizes can also be used.

An encapsulant layer 112 can be disposed on a bottom of the upper substrate 102. In some examples, encapsulant layer 112 is a molded layer formed by injection molding. The encapsulant layer 112 can encapsulate the upper die 108 and the plurality of wire bonds 110, thereby sealing, protecting, and electrically insulating the upper die 108 and wire bonds 110. The encapsulant layer 112 can be formed with a polymer epoxy, or another suitable molded material. In some examples, the encapsulant layer 112 can be formed with a thermosetting polymer or plastic, also known as a thermoset, which can cure irreversibly when exposed to suitable heat.

The encapsulant layer 112 can be shaped to include at least one cavity 114. In some examples, the cavity 114 can be an indentation formed during injection molding of the encapsulant layer 112. The cavity 114 can have a footprint sized to accommodate a lower die 116, so that when the memory system 100 is assembled, the lower die 116 can extend at least partially into the cavity 114 in the encapsulant layer 112. In some examples, the lower die 116 can be a system on chip (SOC) die, or a processor. In some examples, the cavity 114 extends fully to the upper die 108 (e.g., the cavity 114 includes an aperture extending to the upper die 108). In other examples, the cavity 114 extends only partially to the upper die 108. As a specific example, if the lower die 116 has a rectangular shape, when viewed from above, then the footprint of the cavity can be a slightly larger-sized rectangle that leaves suitable clearance around the lateral perimeter of the lower die 116 and at the top of the lower die 116. Such a cavity 114 can advantageously allow the elements of the memory system 100 to be packed more closely together, and can reduce a Z-height 130 of the elements attached to the motherboard 132 in the memory system 100. In the geometry of FIG. 1, the Z-height is defined as a longitudinal distance between a top surface of the upper package core 104 and a top surface of the motherboard 132. Other suitable definitions of Z-height can also be used.

The encapsulant layer 112 can define a plurality of vias 118 extending through the encapsulant layer 112 to the upper substrate 102. Each of the plurality of vias 118 can be filled with electrically conductive solder. The solder in the vias 118 can provide respective electrical connections to respective locations on the upper substrate 102. In some examples, the electrical connections can extend to the upper package build-up layer 106. In some examples, one or more electrical connections can extend to the upper package core 104. In some examples, each via 118 can be formed by laser drilling the encapsulant layer 112, although other suitable fabrication methods can also be used. In some examples, the vias 118 can have a diameter, at the bottom of the encapsulant layer 112, between 0.2 mm and 0.3 mm, although other diameters can also be used.

Taken together, the upper die 108, the upper substrate (which includes the upper package core 104 and the upper package build-up layer 106), the encapsulant layer 112, and the solder-filled vias 118 can form an upper module 128. In some examples, upper module 128 can be a DRAM module. In some examples, the upper module 128 can be manufactured and sold as a stand-alone item. In downstream assembly steps, the upper module 128 can be connected via a ball grid array to a lower package, such as an SOC package, which, in turn, can be connected to a motherboard. In the example of FIG. 1, the DRAM module 128 is used in a package on package (PoP) configuration, in which the lower package 120 is disposed above the motherboard, and the upper module 128 is disposed above the lower package 120. Other suitable configurations can also be used.

An upper ball grid array 122 can be positioned on a bottom of the plurality of vias 118 and electrically connected to the upper substrate 102 through the solder disposed in the respective vias 118. The upper ball grid array 122 can include electrically conductive solder, dispensed by machine in balls of well-controlled volume and well-controlled position. When heated to a suitable temperature, the balls melt and reflow to relieve surface tension. When the heat is removed, each ball forms a respective electrical connection between the upper substrate 102, positioned above the upper ball grid array 122, and a system on chip (SOC) package 120, positioned below the upper ball grid array 122.

The lower package 120 can be generally planar, and can include one or more electrical components and/or one or more electrical connectors arranged in a predetermined pattern. The lower package 120 can mechanically support the lower die 116, and can provide an interface and suitable electrically conductive circuitry to electrically connect the lower die 116 to both the upper module 128 and the motherboard 132.

Lower die 116 can be disposed on a top of the lower package 120 and electrically connected to the lower package 120. The lower die 116 can be an application-specific integrated circuit (ASIC), which can perform computational tasks specific to a particular application. Dedicating a hardware chip to these application-specific computation tasks, rather than relying on the motherboard 132 to perform the tasks, can improve efficiency of the device. Positioning the lower die 116 close to the upper module 128, including dedicated electrical connections between them provided by the upper ball grid array 122, can also improve efficiency of the device.

A lower ball grid array 124 can be positioned below the lower package 120, and can electrically connect the lower package 120 to the motherboard 132. In general, the lower die 116 can require more connections to the motherboard 132 than to the upper die 108, so that the lower ball grid array 124 can include more solder balls than the upper ball grid array 122.

In the geometry of FIG. 1, the upper die 108 and the lower die 116 are both positioned between the upper substrate 102 and the lower package 120. Positioning the upper die 108 and the lower die 116 in this manner can allow the lower die 116 to extend at least partially into the cavity 114 in the encapsulant layer 112, and thereby advantageously reduce the Z-height 130 of the elements attached to the motherboard 132 in the memory system 100. In addition, the upper substrate 102 can form its electrical connections on only one side of the upper substrate 102, so that the upper substrate 102 can include just one build-up layer 106 on one side of the upper package core 104, rather than including build-up layers on both sides of the upper package core 104. This can reduce the thickness of the upper substrate 102 by a height of one build-up layer, which can further advantageously reduce the Z-height 130 of the elements attached to the motherboard 132 in the memory system 100.

Figure 2:
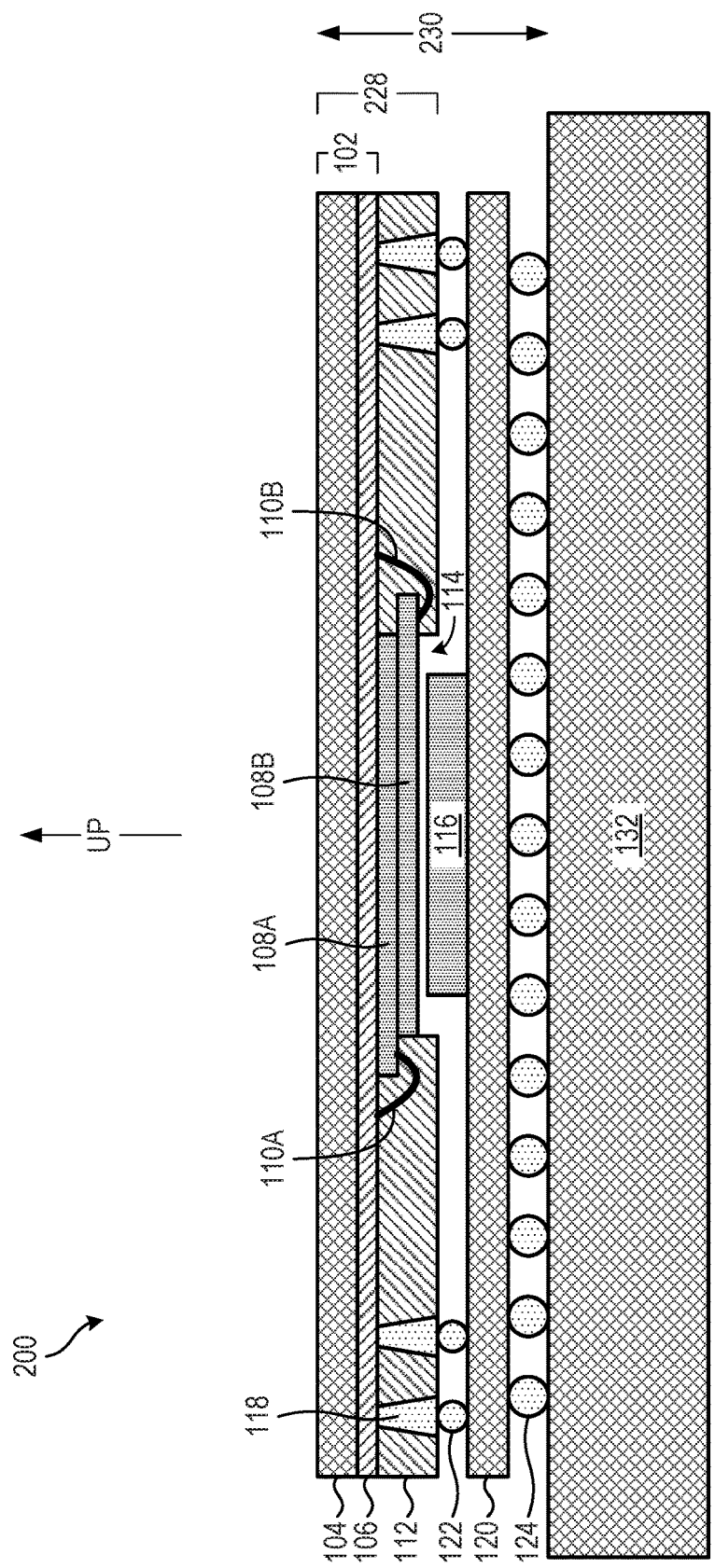
FIG. 2 shows a cross-sectional side view of an example of a memory system having multiple upper dies and a cavity laterally aligned with the upper dies, in accordance with some embodiments.

FIG. 2 shows a cross-sectional side view of another example of a memory system 200, in accordance with some embodiments. Compared with the memory system 100 of FIG. 1, the memory system 200 includes multiple upper dies and a cavity laterally aligned with the upper dies. The memory system 200 of FIG. 2 is but one example of a memory system; other suitable memory systems can also be used.

Elements of memory system 200 that differ from the memory system 100 of FIG. 1 include an upper module 228 that includes multiple upper dies 108A-B, each of which is wire-bonded to the upper substrate 102 by respective wire bonds 110A-B. In some examples, a first upper die 108A can be positioned on a bottom of the upper substrate 102, and electrically connected to the upper substrate 102 with a plurality of wire bonds 110A. In some examples, a second upper die 108B can be positioned on the first upper die 108A and electrically connected to the upper substrate 102 with a second plurality of wire bonds 110B. In some examples, the encapsulant layer 112 encapsulates the first and second upper dies 108A-B and the first and second pluralities of wire bonds 110A-B. In some examples, the first and second upper dies 108A-B can be adhered to one another with an adhesive film. For reasons similar to those discussed for FIG. 1, the memory system 200 of FIG. 2 has a reduced Z-height 230 of the elements attached to the motherboard 132.

Figure 3:
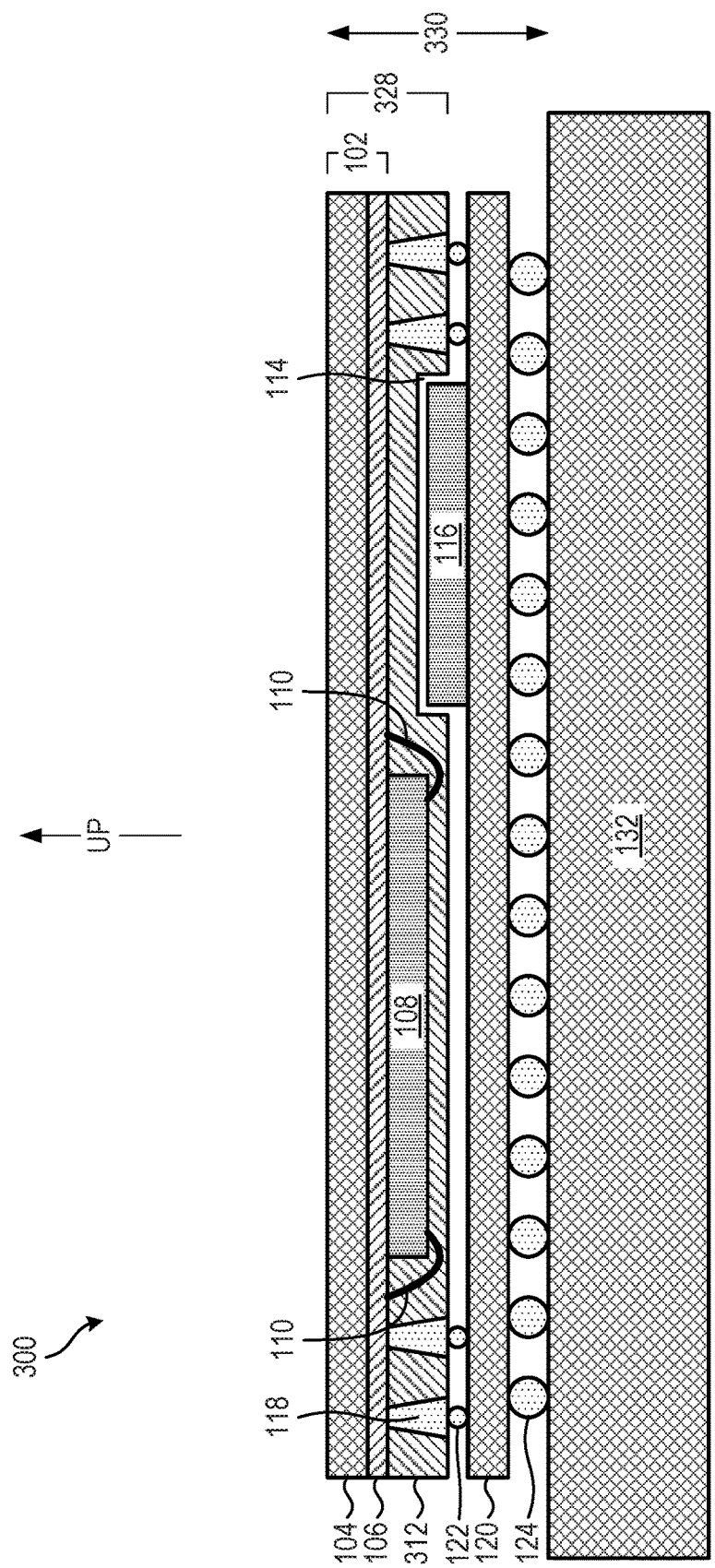
FIG. 3 shows a cross-sectional side view of an example of a memory system having a single upper die and a cavity laterally displaced from the upper die, in accordance with some embodiments.

FIG. 3 shows a cross-sectional side view of another example of a memory system 300, in accordance with some embodiments. Compared with the memory system 100 of FIG. 1, the memory system 300 includes a single upper die and a cavity laterally displaced from the upper die. The memory system 300 of FIG. 3 is but one example of a memory system; other suitable memory systems can also be used.

Elements of memory system 300 that differ from the memory system 100 of FIG. 1 include an upper module 328 that includes a lateral displacement between the upper die 108 and the lower die 116, and a differently-shaped encapsulant layer 312, which positions the cavity 114 to align with the lateral position of the lower die 116.

In some examples, the memory system 300 can further reduce the Z-height 330, because the lower die 116 can extend further into the cavity 114, without the problem of contacting the upper die 108. For these examples, a longitudinal distance between a top of the cavity 114 and the upper substrate 102 can be less than a longitudinal distance between a bottom of the first upper die 108 and the upper substrate 102.

Figure 4:
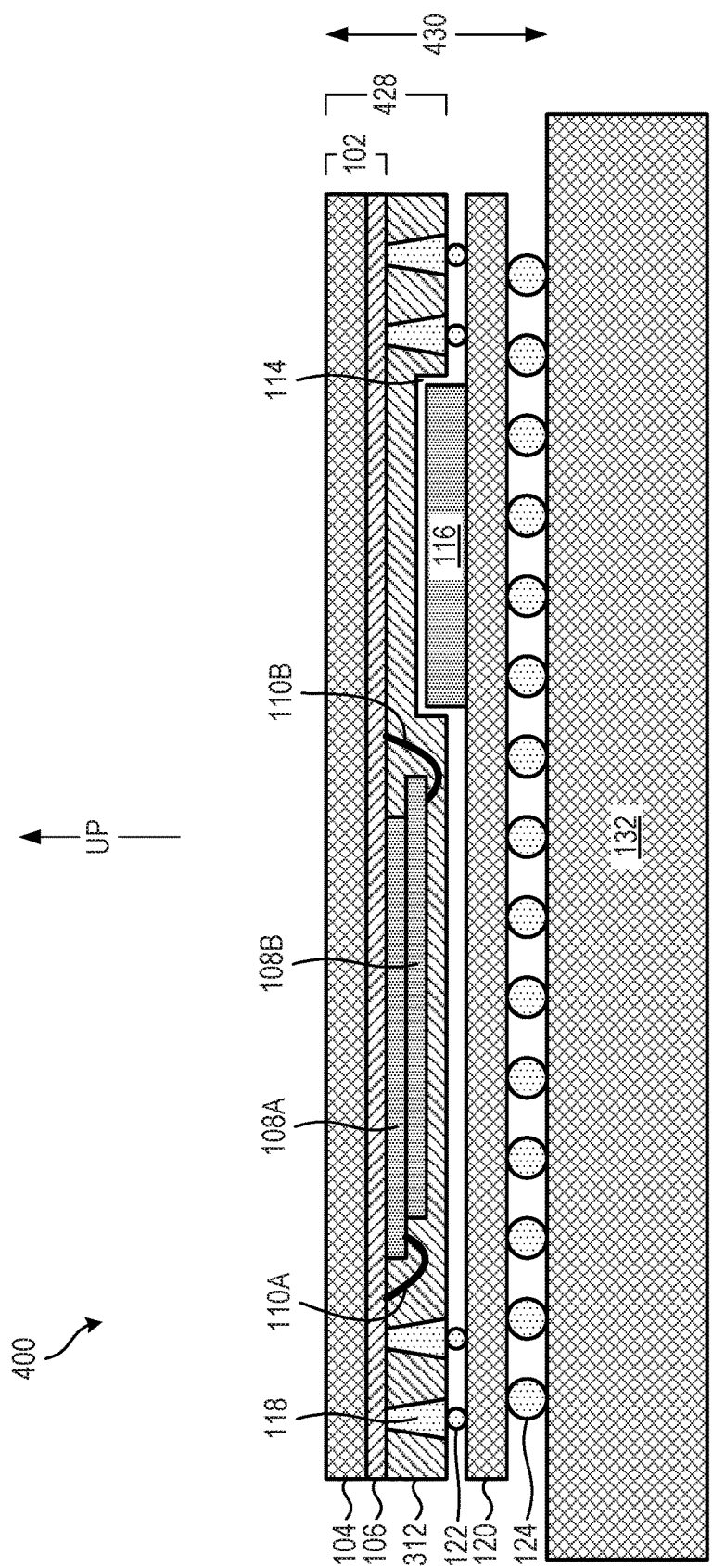
FIG. 4 shows a cross-sectional side view of an example of a memory system having multiple upper dies and a cavity laterally displaced from the upper dies, in accordance with some embodiments.

FIG. 4 shows a cross-sectional side view of another example of a memory system 400, in accordance with some embodiments. Compared with the memory system 300 of FIG. 3, the memory system 400 includes multiple upper dies and a cavity laterally displaced from the upper dies. The memory system 400 of FIG. 4 is but one example of a memory system; other suitable memory systems can also be used.

Elements of memory system 400 that differ from the memory system 300 of FIG. 3 include an upper module 428 that includes a lateral displacement between the upper dies 108A-B and the lower die 116, and wire bonds 110A-B that connect the respective upper dies 108A-B to the upper substrate 102. For reasons similar to those discussed for FIGS. 2 and 3, the memory system 400 of FIG. 4 has a reduced Z-height 430 of the elements attached to the motherboard 132.

Figure 5:
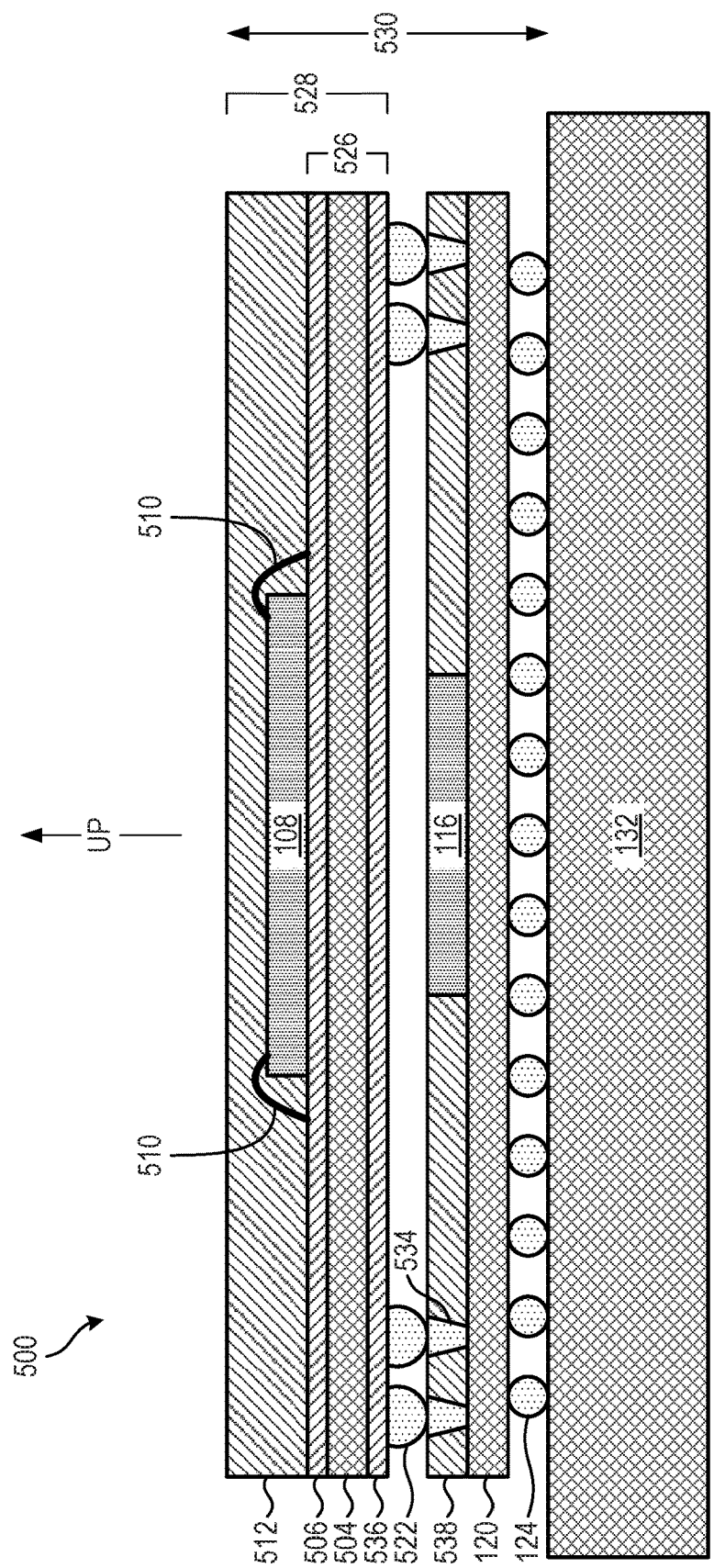
FIG. 5 shows a cross-sectional side view of an example of a memory system, in which the lower die and the upper die are positioned on opposite sides of the upper substrate, in accordance with some embodiments.

To demonstrate that the memory systems of FIGS. 1-4 can reduce the Z-height of elements attached to the motherboard 132, FIG. 5 shows a cross-sectional side view of an example of a dynamic random-access memory (DRAM) system 500, which can correspond to more conventional package on package configurations. Compared to the configurations of FIGS. 1-4, upper module 528 is inverted, top-to-bottom, so that the lower die 116 and the upper die 108 are positioned on opposite sides of the upper substrate 526.

In the example of FIG. 5, an encapsulant layer 538 is disposed on a top of lower package 120, and at least partially encapsulates the lower die 116. Molded layer includes a plurality of solder-filled vias 538 that, when assembled, connect to ball grid array 522, and in turn, connect to the upper substrate 526.

In the geometry of FIG. 5, the upper substrate 526 electrically connects to elements both above and below the upper substrate 526. Therefore, the upper substrate 526 includes two build-up layers 506, 536 on opposite sides of the upper package core 504. Compared to the configurations of FIGS. 1-4, in which the upper substrate only connects to elements below the upper substrate, the upper substrate 526 includes an extra build-up layer. As a result, the Z-height 530 of the upper module 528 includes the thickness of the extra build-up layer. This is disadvantageous, compared to the single-sided geometries of FIGS. 1-4. In addition, encapsulant layer 512 lacks a cavity, which would otherwise be used to accommodate at least a portion of the lower die 116. This is an additional disadvantage of the geometry of FIG. 5.

Figure 6:
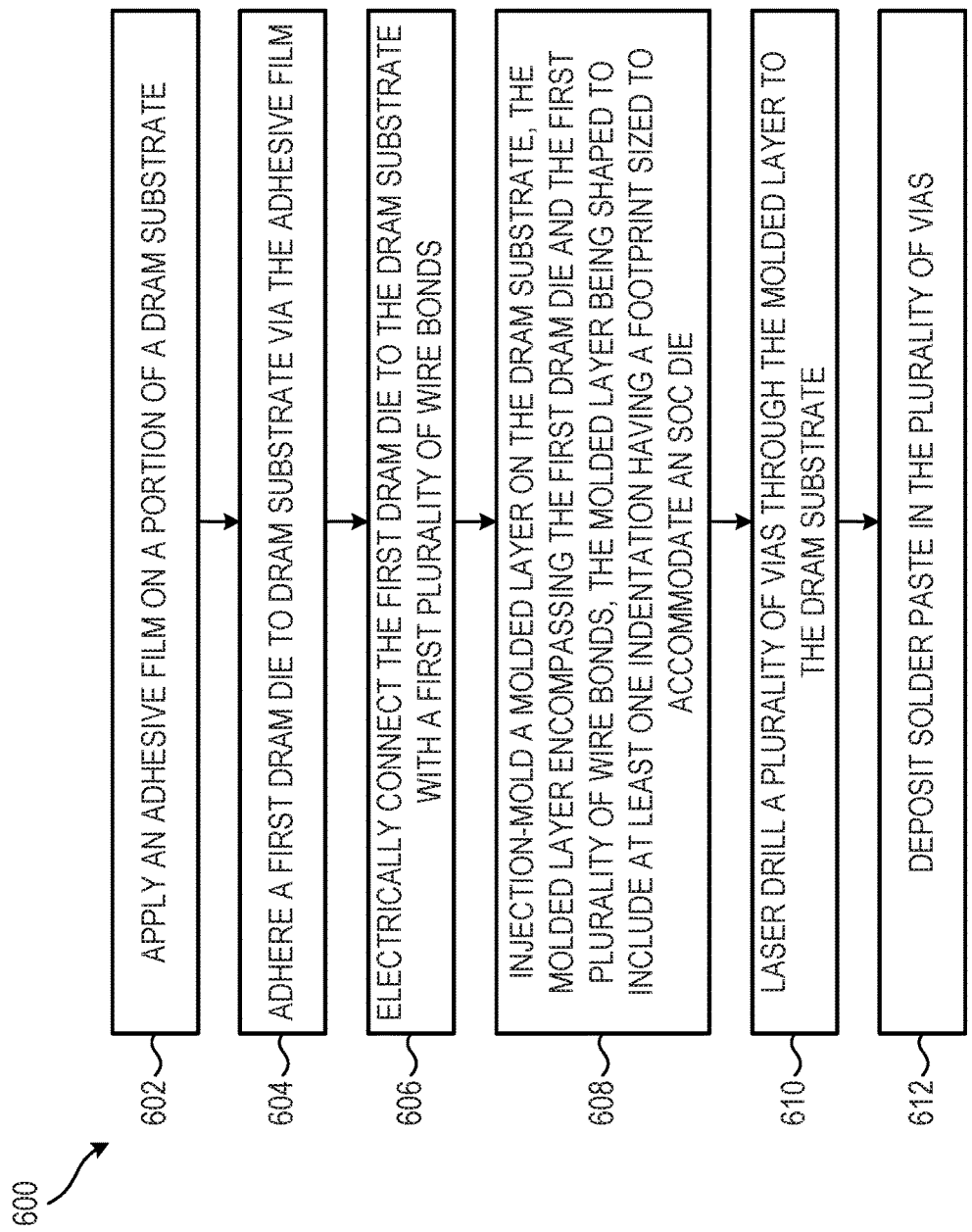
FIG. 6 shows an example of a method for fabricating a dynamic random-access memory (DRAM) module, in accordance with some embodiments.

FIG. 6 shows an example of a method 600 for fabricating a dynamic random-access memory (DRAM) module, in accordance with some embodiments. In some examples, method 600 can be used to fabricate upper modules 128, 228, 328, and 428 from FIGS. 1-4. Method 600 can be used to fabricate other DRAM modules, as well. Method 600 is but one example of a method that can be used to fabricate a DRAM module; other suitable methods can also be used.

At operation 602, an adhesive film can be applied on a portion of a DRAM substrate.

At operation 604, a first DRAM die can be adhered to the DRAM substrate via the adhesive film.

At operation 606, the first DRAM die can electrically connect to the DRAM substrate with a first plurality of wire bonds.

At operation 608, a molded layer can be injection-molded on the DRAM substrate. The molded layer can encapsulate the first DRAM die and the first plurality of wire bonds. The molded layer can be shaped to include at least one cavity having a footprint sized to accommodate a system on chip (SOC) die.

At operation 610, a plurality of vias can be laser drilled through the molded layer to the DRAM substrate;

At operation 612, solder paste can be deposited in the plurality of vias. In some examples, method 600 can optionally further include heating the solder paste to reflow the solder paste.

The following non-limiting list of examples can further illustrate the present memory system, DRAM memory system, and method of fabricating a DRAM memory module.

In Example 1, a memory system can include an upper substrate; a first upper die positioned on a bottom of the upper substrate and electrically connected to the upper substrate with a first plurality of wire bonds; and an encapsulant layer disposed on a bottom of the upper substrate and encapsulating the first upper die and the first plurality of wire bonds, the encapsulant layer being shaped to include at least one cavity having a footprint sized to accommodate a lower die.

In Example 2, the memory system of Example 1 can optionally be configured such that a top side of the upper substrate lacks electrical connections.

In Example 3, the memory system of any one of Examples 1-2 can optionally be configured such that the upper substrate comprises: an upper package core having a top side that lacks electrical connections; and an upper package build-up layer disposed on a bottom side of the upper package core and including electrically conductive material.

In Example 4, the memory system of any one of Examples 1-3 can optionally be configured such that the encapsulant layer defines a plurality of vias extending through the encapsulant layer to the upper substrate; and each of the plurality of vias is filled with electrically conductive solder.

In Example 5, the memory system of any one of Examples 1-4 can optionally be configured such that each of the plurality of vias is positioned to electrically connect the upper package build-up layer to a lower package for the lower die, via an upper ball grid array.

In Example 6, the memory system of any one of Examples 1-5 can optionally be configured such that when the upper substrate is electrically connected to the lower package for the lower die, the first upper die and the lower die are both positioned between the upper substrate and the lower package.

In Example 7, the memory system of any one of Examples 1-6 can optionally be configured to further include an upper ball grid array positioned on a bottom of the plurality of vias and electrically connected to the upper substrate through the solder disposed in the respective vias; a lower package for the lower die, the lower package being positioned below the upper ball grid array and electrically connected to the upper substrate via the upper ball grid array; and a lower die disposed on a top of the lower package and electrically connected to the lower package, wherein the first upper die and the lower die are both positioned between the upper substrate and the lower package.

In Example 8, the memory system of any one of Examples 1-7 can optionally be configured to further include a motherboard positioned below the lower package and electrically connected to the lower package by a lower ball grid array.

In Example 9, the memory system of any one of Examples 1-8 can optionally be configured to further include a second upper die positioned on the first upper die and electrically connected to the upper substrate with a second plurality of wire bonds, wherein the encapsulant layer further encapsulates the second upper die and the second plurality of wire bonds.

In Example 10, the memory system of any one of Examples 1-9 can optionally be configured such that the footprint is rectangular.

In Example 11, the memory system of any one of Examples 1-10 can optionally be configured such that the cavity is laterally aligned with the first upper die.

In Example 12, the memory system of any one of Examples 1-11 can optionally be configured such that the cavity comprises an aperture extending to the first upper die.

In Example 13, the memory system of any one of Examples 1-12 can optionally be configured such that the cavity is laterally displaced from the first upper die.

In Example 14, the memory system of any one of Examples 1-13 can optionally be configured such that a longitudinal distance between a top of the cavity and the upper substrate is less than a longitudinal distance between a bottom of the first upper die and the upper substrate.

In Example 15, the memory system of any one of Examples 1-14 can optionally be configured such that the memory system is a dynamic random-access memory (DRAM) system; the upper substrate is a DRAM substrate; the first upper die is a DRAM die; the encapsulant layer is a molded layer; and the lower die is a system on chip (SOC) die.

In Example 16, a dynamic random-access memory (DRAM) system can include: a DRAM package core having a top side that lacks electrical connections; a DRAM package build-up layer disposed on a bottom side of the DRAM package core and including electrically conductive material; a first DRAM die positioned on a bottom of the DRAM package build-up layer and electrically connected to the DRAM package build-up layer with a first plurality of wire bonds; and a encapsulant layer disposed on a bottom of the DRAM package build-up layer and encapsulating the first DRAM die and the first plurality of wire bonds, the encapsulant layer being shaped to include at least one cavity having a footprint sized to accommodate a system on chip (SOC) die, the encapsulant layer defining a plurality of vias extending through the encapsulant layer to the DRAM package build-up layer, wherein each of the plurality of vias is filled with electrically conductive solder.

In Example 17, a method for fabricating a dynamic random-access memory (DRAM) module can include: applying an adhesive film on a portion of a DRAM substrate; adhering a first DRAM die to the DRAM substrate via the adhesive film; electrically connecting the first DRAM die to the DRAM substrate with a first plurality of wire bonds; injection-molding a molded layer on the DRAM substrate, the molded layer encapsulating the first DRAM die and the first plurality of wire bonds, the molded layer being shaped to include at least one cavity having a footprint sized to accommodate a system on chip (SOC) die; laser drilling a plurality of vias through the molded layer to the DRAM substrate; and depositing solder paste in the plurality of vias.

In Example 18, the method of Example 17 can optionally further include heating the solder paste to reflow the solder paste.

In Example 19, the method of any one of Examples 17-18 can optionally be configured such that the DRAM substrate includes a DRAM package build-up layer disposed on a DRAM package core; and the adhesive film is applied on the DRAM package build-up layer.

In Example 20, the method of any one of Examples 17-19 can optionally be configured to further include adhering a second DRAM die to first DRAM die; and electrically connecting the second DRAM die to the DRAM substrate with a second plurality of wire bonds; wherein the molded layer further encapsulates the second DRAM die and the second plurality of wire bonds.

In Example 21, the memory system, DRAM memory system, or method of any one or any combination of Examples 1-20 can optionally be configured such that all elements, operations, or other options recited are available to use or select from.

Some embodiments may be implemented in one or a combination of hardware, firmware and software. Embodiments may also be implemented as instructions stored on a computer-readable storage device, which may be read and executed by at least one data processing device to perform the operations described herein. A computer-readable storage device may include any non-transitory mechanism for storing information in a form readable by a machine (e.g., a computer). For example, a computer-readable storage device may include read-only memory (ROM), random-access memory (RAM), magnetic disk storage media, optical storage media, flash-memory devices, and other storage devices and media. In some embodiments, checkout terminals may include one or more data processing devices and may be configured with instructions stored on a computer-readable storage device.

What is claimed is:

1. A memory system, comprising:
   an upper substrate;
   a first upper die coupled to a bottom side of the upper substrate and electrically connected to the upper substrate with a first plurality of wire bonds;
   an encapsulant layer disposed on the bottom side of the upper substrate and the first upper die and the first plurality of wire bonds, the encapsulant layer being shaped to include at least one cavity in communication with the first upper die, and the at least one cavity has a first width and a footprint sized to accommodate a lower die;
   a plurality of vias including solder, wherein the plurality of vias extend through the encapsulant layer and are coupled to the upper substrate;
   a lower package including the lower die disposed on a surface of the lower package, the lower package coupled to the plurality of vias with a plurality of solder balls; and
   wherein the first upper die and the lower die are positioned between the upper substrate and the lower package, and
   wherein the lower die has a second width and the second width is less than the first width.

2. The memory system of claim 1, wherein a top side of the upper substrate lacks electrical connections.

3. The memory system of claim 1, wherein the upper substrate comprises:
   an upper package core having a top side that lacks electrical connections; and
   an upper package build-up layer disposed on a bottom side of the upper package core and including electrically conductive material.

4. The memory system of claim 1, wherein a portion of the lower die that is coupled to the surface of the lower package is positioned in the cavity.

5. The memory system of claim 1, wherein each of the plurality of vias is positioned to electrically connect an upper package build-up layer to the lower package for the lower die, via the plurality of solder balls.

6. The memory system of claim 1, further comprising:
   a motherboard positioned below the lower package and electrically connected to the lower package by solder balls.

7. The memory system of claim 1, further comprising a second upper die positioned on the first upper die and electrically connected to the upper substrate with a second plurality of wire bonds, wherein the encapsulant layer further encapsulates the second upper die and the second plurality of wire bonds.

8. The memory system of claim 1, wherein the footprint is rectangular.

9. The memory system of claim 1, wherein the cavity is laterally aligned with the first upper die.

10. The memory system of claim 1, wherein the cavity is laterally displaced from the first upper die.

11. The memory system of claim 10, wherein a longitudinal distance between a top of the cavity and the upper substrate is less than a longitudinal distance between a bottom of the first upper die and the upper substrate.

12. The memory system of claim 1, wherein:
   the memory system is a dynamic random-access memory (DRAM) system;
   the upper substrate is a DRAM substrate;
   the first upper die is a DRAM die;
   the encapsulant layer is a molded layer; and
   the lower die is a system on chip (SOC) die.

13. A dynamic random-access memory (DRAM) system, comprising:

a DRAM package core having a top side that lacks electrical connections;

a DRAM package build-up layer disposed on a bottom side of the DRAM package core and including electrically conductive material;

a first DRAM die positioned on the bottom of the DRAM package build-up layer and electrically connected to the DRAM package build-up layer with a first plurality of wire bonds; and a encapsulant layer disposed on the bottom of the DRAM package build-up layer and encapsulating the first DRAM die and the first plurality of wire bonds, the encapsulant layer being shaped to include at least one cavity in communication with the first DRAM die, and the at least one cavity has a first width and a footprint sized to accommodate a system on chip (SOC) die, the encapsulant layer defining a plurality of vias extending through the encapsulant layer to the DRAM package build-up layer, wherein each of the plurality of vias is filled with electrically conductive solder, a lower package including the SOC die disposed on a surface of the lower package, the lower package coupled to the plurality of vias with a plurality of solder balls; and wherein the first DRAM die and the SOC die are positioned between the DRAM package core and the lower package, and wherein the SOC die has a second width and the second width is less than the first width.

* * * * *